United States Patent
Roth et al.

(10) Patent No.: US 11,402,575 B2
(45) Date of Patent: *Aug. 2, 2022

(54) PHOTODETECTOR WITH SEQUENTIAL ASYMMETRIC-WIDTH WAVEGUIDES

(71) Applicant: Aurrion, Inc., Goleta, CA (US)

(72) Inventors: Jonathan Edgar Roth, San Francisco, CA (US); Jared Bauters, Santa Barbara, CA (US); Erik Johan Norberg, Santa Barbara, CA (US)

(73) Assignee: Aurrion, Inc., Goleta, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/032,615

(22) Filed: Sep. 25, 2020

(65) Prior Publication Data

US 2021/0026067 A1    Jan. 28, 2021

Related U.S. Application Data (63) Continuation of application No. 16/233,498, filed on Dec. 27, 2018, now Pat. No. 10,802,213.

(51) Int. Cl.
*G02B 6/12*         (2006.01)
*G02B 6/122*        (2006.01)
(Continued)

(52) U.S. Cl.
CPC ....... *G02B 6/12004* (2013.01); *G02B 6/1228* (2013.01); *G02B 6/4207* (2013.01);
(Continued)

(58) Field of Classification Search
CPC .................................................. G02B 6/4207
See application file for complete search history.

(56) References Cited

U.S. PATENT DOCUMENTS

| 5,137,357 A | 8/1992 | Ferrar et al. |
|---|---|---|
| 5,809,184 A | 9/1998 | Doerr et al. |

(Continued)

FOREIGN PATENT DOCUMENTS

| CN | 106461871 | 2/2017 |
|---|---|---|
| CN | 108563030 | 9/2018 |

(Continued)

OTHER PUBLICATIONS

"Chinese Application Serial No. 201910567322.7, Response filed Jun. 10, 2021 to Office Action dated Feb. 20, 2021", With English claims, 12 pages.

(Continued)

*Primary Examiner* — Eric Wong
(74) *Attorney, Agent, or Firm* — Schwegman Lundberg & Woessner, P.A.

(57) ABSTRACT

Described are various configurations of optical structures having asymmetric-width waveguides. A photodetector can include parallel waveguides that have different widths, which can be connected via passive waveguide. One or more light absorbing regions can be proximate to the waveguides to absorb light propagating through one or more of the parallel waveguides. Multiple photodetectors having asymmetric width waveguides can operate to transduce light in different modes in a polarization diversity optical receiver.

20 Claims, 10 Drawing Sheets

(51) Int. Cl.
  *G02B 6/42* (2006.01)
  *H01L 27/146* (2006.01)
  *H01L 31/105* (2006.01)

(52) U.S. Cl.
  CPC ............. *H01L 27/14625* (2013.01); *G02B 2006/1215* (2013.01); *G02B 2006/12061* (2013.01); *G02B 2006/12138* (2013.01); *H01L 31/105* (2013.01)

(56) References Cited

U.S. PATENT DOCUMENTS

| | | | |
|---|---|---|---|
| 9,310,561 | B1 | 4/2016 | Roth |
| 2014/0023314 | A1 | 1/2014 | Onishi |
| 2017/0163001 | A1* | 6/2017 | Evans ................ H01S 5/06256 |
| 2017/0293083 | A1 | 10/2017 | Menard et al. |
| 2020/0073051 | A1* | 3/2020 | Baudot ................ G02B 6/122 |
| 2020/0209472 | A1 | 7/2020 | Roth et al. |

FOREIGN PATENT DOCUMENTS

| | | |
|---|---|---|
| CN | 111381317 A | 7/2020 |
| FR | 3056769 A1 | 3/2018 |
| KR | 102262796 | 6/2021 |
| SG | 10201904874 | 7/2020 |
| TW | 202024698 A | 7/2020 |

OTHER PUBLICATIONS

"Chinese Application Serial No. 201910567322.7, Office Action dated Aug. 26, 2021", With English translation, 8 pages.

U.S. Appl. No. 16/233,498, U.S. Pat. No. 10,802,213, filed Dec. 27, 2018, Photodetector With Sequential Asymmetric-Width Waveguides.

"U.S. Appl. No. 16/233,498, Non Final Office Action dated Jan. 17, 2020", 7 pgs.

"U.S. Appl. No. 16/233,498, Notice of Allowance dated Jun. 12, 2020", 9 pgs.

"U.S. Appl. No. 16/233,498, Response filed Apr. 15, 2020 to Non Final Office Action dated Jan. 17, 2020", 14 pgs.

"European Application Serial No. 19181455.7, Extended European Search Report dated Jan. 27, 2020", 7 pgs.

"Chinese Application Serial No. 201910567322.7, Office Action dated Feb. 20, 2021", w English Translation, 12 pgs.

"Chinese Application Serial No. 201910567322.7, Voluntary Amendment dated Oct. 20, 2020", w English Claims, 12 pgs.

"Korean Application Serial No. 10-2019-0076941, Voluntary Amendment dated Oct. 29, 2020", w English Claims, 12 pgs.

"European Application Serial No. 19181455.7, Response filed Jan. 4, 2021 to Extended European Search Report dated Jan. 27, 2020", 17 pgs.

\* cited by examiner

PHOTODETECTOR WITH SEQUENTIAL ASYMMETRIC-WIDTH WAVEGUIDES

PRIORITY

This application is a continuation of U.S. patent application Ser. No. 16/233,498, filed Dec. 27, 2018, which has been incorporated by reference herein in its entirety.

TECHNICAL FIELD

The present disclosure generally relates to optical devices, and more particularly to optical devices comprising waveguides.

BACKGROUND

Some optical devices exhibit signal distortion due to polarization dependent effects, such as polarization dependent loss (PDL) or gain. Some conventional approaches attempt to mitigate PDL by utilizing separate optical components and optical paths within a device for different polarization states. However, such solutions detrimentally affect the bandwidth capabilities of the device and increase device size.

BRIEF DESCRIPTION OF THE DRAWINGS

The following description includes discussion of figures having illustrations given by way of example of implementations of embodiments of the disclosure. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive. To easily identify the discussion of any particular element or act, the most significant digit or digits in a reference number refer to the figure ("FIG.") number in which that element or act is first introduced.

Descriptions of certain details and implementations follow, including a description of the figures, which may depict some or all of the embodiments described below, as well as discussing other potential embodiments or implementations of the inventive concepts presented herein. An overview of embodiments of the disclosure is provided below, followed by a more detailed description with reference to the drawings.

DETAILED DESCRIPTION

In the following description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, structures, and techniques are not necessarily shown in detail.

In polarization diversity photonic integrated circuit (PIC) receivers, the polarization of light received from single-mode fiber is unknown and can exhibit variable polarization due to different causes, such as temperature changes or vibrations of the single-mode fiber. In some configurations, a polarization diversity PIC receiver separates light into two separate paths for orthogonal input polarizations. Light in the two separate paths undergo the same optical functions, e.g., the light is transduced by a photodetector (e.g., absorbing semiconductor mesa) in each path with substantially the same responsivity. Responsivity is the ratio of the photo-current due to the received light absorbed by the photodetector divided by the total optical power entering the photodetector.

For a heterogeneous silicon photonics platform in which silicon waveguides are used for light routing and filtering functions, and other materials such as III-V epitaxially grown crystals are used as photodetector mesas, the process design configuration may be such that the minimum width of a silicon waveguide is much narrower than the minimum width of a III-V photodetector mesa. In design of the photodiode mesa there is a trade-off between increased responsivity and device speed; the optimization of these two parameters is limited by the minimum width of a III-V photodetector mesa. While increasing the light absorbing area of the photodetector may increase responsivity (e.g., increasing the fraction of light absorbed by the photodetector from nearby waveguides), the increased area also increases the device's capacitance which degrades the resistor-capacitor (RC) time constant of the photodetector. If it were possible to make the III-V photodetector mesa as narrow as a silicon waveguide, a better simultaneous optimization of responsivity and device speed would be possible.

To this end, a high-speed photodetector can increase responsivity while limiting device capacitance by implementing two parallel waveguides disposed under the same light absorbing layer (e.g., a III-V photodetector mesa), effectively doubling the absorption length of light interacting with a single III-V photodetector mesa, and minimizing or eliminating the penalty in the optimization of responsivity and device speed which was due to the difference of the minimum widths of a III-V photodetector mesa and silicon waveguide. The two parallel waveguides have different widths to avoid light coupling between the two waveguides.

In one example embodiment, the two parallel waveguides are connected via a passive waveguide. In this example embodiment, the light absorbing layer partially absorbs a light beam as it propagates along the first waveguide and further partially absorbs the same light beam as it propagates along the second waveguide by way of the passive waveguide.

In some example embodiments, a polarization diversity PIC receiver comprises a first high-speed photodetector and a second high-speed photodetector that operate in parallel to process multiple beams of light in different polarization states. In some example embodiments, a polarization diversity PIC receiver comprises a first high-speed photodetector and a second high-speed photodetector that operate in a tandem arrangement to process multiple beams of light in different polarization states. Electrical signals generated by the photodetector can be combined via common electrical contacts.

Figure 1:
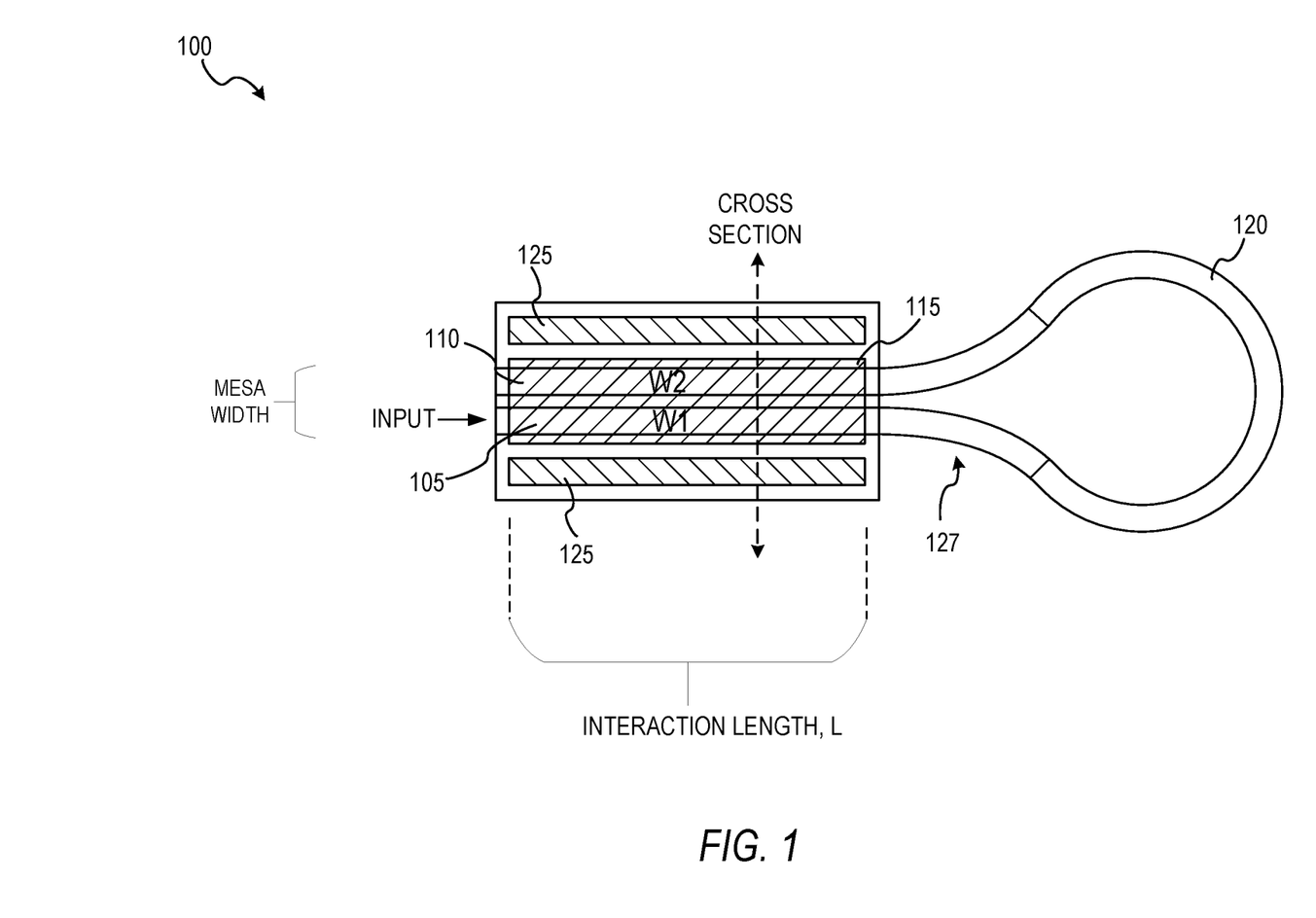
FIG. 1 shows a photodetector with sequential waveguides, according to some example embodiments.

FIG. 1 shows a photodetector 100 (e.g., photodiode) viewed from the top, according to some example embodiments. The photodetector 100 comprises a light absorbing layer 115 (e.g., a semiconductor mesa, III-V epitaxy, II-VI epitaxy) which is disposed over two waveguides 105 and 110 (e.g., silicon waveguides, diamond waveguides). In the example embodiment of FIG. 1, the two waveguides 105 and 110 are connected in a sequence by a passive waveguide loop 120 (e.g., a routing, a delay). Light that is input into the photodetector 100 is partially absorbed by the light absorbing layer 115 as the light propagates along the first waveguide 105 ("W1") and further partially absorbed by the light absorbing layer 115 as the light travels along the second waveguide 110 ("W2") via waveguide loop 120. In this way, the same light passes twice under the light absorbing layer 115, thereby doubling an interaction length L, between the light and the light absorbing layer 115 without increasing the area and capacitance of the light absorbing layer 115.

As used here, the waveguides are sequential (i.e., in sequence) in that a light beam undergoes two consecutive absorbing events (e.g., a first absorbing event via W1 and a second absorbing event via W2). In some example embodiments, the sequential waveguides may be divided between two photodetectors that function in tandem. For example, a first absorbing event of W1 may occur in a first photodetector and a second absorbing event of W2 may occur in a second photodetector, where the first and second photodetectors are in a tandem arrangement, as discussed in further detail with reference to FIG. 7 below.

The top of the light absorbing layer 115 is an electrical contact to a first type of doped semiconductor (e.g., P-type, N-type) as indicated by the forward diagonal line shading in the light absorbing layer 115. The photodetector 100 further comprises semiconductor areas that are electrical contacts 125 to a second type of doped semiconductor that is opposite of the first type (e.g., P-type, N-type), as indicated by the backward diagonal line shading in the electrical contacts 125. The light absorbing layer may include a vertical stack-up of semiconductor materials comprising, from top to bottom, the first type of doped semiconductor, intrinsic (undoped) semiconductor, and the second type of doped semiconductor. The second type of doped semiconductor may extend horizontally spanning absorbing layer 115 and electrical contacts 125. The light absorbing layer 115 and electrical contacts 125 function in concert to transduce light propagating in the waveguides 105 and 110 into electrical flow (e.g., one or more electrical signals).

In some example embodiments, the two waveguide paths 105 and 110 have different widths to avoid light coupling from path 105 to path 110, and vice versa. In some example embodiments, the waveguide paths 105 and 110 (have different widths at least for the length (e.g., interaction length L) under the mesa and may have the same width for portions not under the light absorbing layer 115 (e.g., the mesa), according to design parameters of different example embodiments. The waveguide paths 105 and 110 and loop 120 can be implemented as rib type, wire type, or other types. In some example embodiments, to keep the silicon path length short, waveguide paths 105 and 110 are rib type, and the loop 120 is a wire type waveguide so that the bend radius of the loop is tighter. In some example embodiments, the waveguide loop 120 is tapered to adjust for width differences between the two silicon waveguides 105 and 110. In some example embodiments, the bend areas 127 of the waveguides 105 and 110 are tapered to adjust for width differences (e.g., each end of the waveguide loop is the same width and the bend areas 127 compensate to adjust for width differences).

Figure 2:
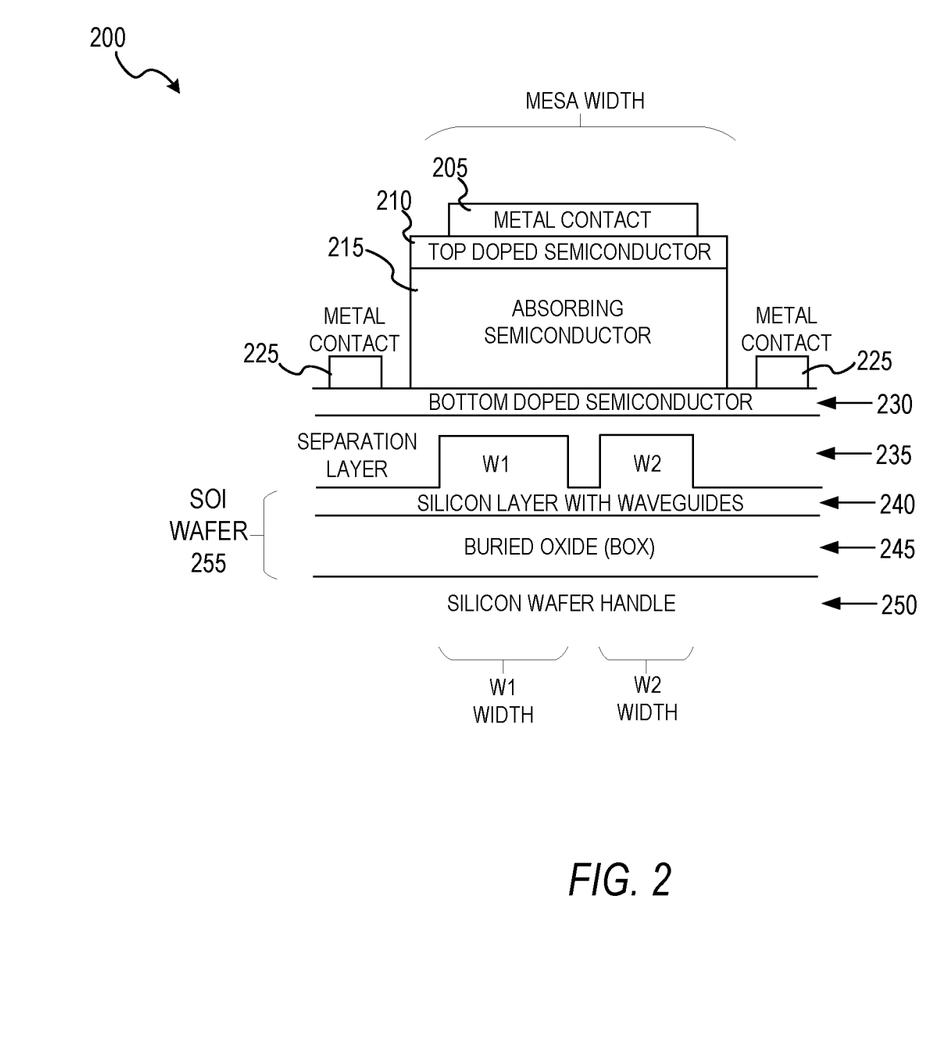
FIG. 2 shows a cross-section of a photodetector, according to some example embodiments.

FIG. 2 shows a cross-section of a photodetector 200, according to some example embodiments. The cross-section view in FIG. 2 corresponds to the cross-section double-sided dotted arrow in FIG. 1. Although photodetector 200 in the example of FIG. 2 is a P-I-N architecture, it is appreciated that the sequential waveguides can be integrated into other photodetectors and geometries (e.g., uni-travelling carrier photodiode, avalanche diode, or a photoconductive device). As illustrated, the photodetector 200 can comprise a metal contact 205 that is disposed on a top doped semiconductor 210, which is disposed on an absorbing semiconductor 215, and a bottom doped semiconductor 230 that is connected to metal contacts 225.

The light absorbing layer 115 (having forward diagonal line shading in FIG. 1) corresponds to a mesa structure comprising the metal contact 205, the top doped semiconductor 210, and the absorbing semiconductor 215 (see "MESA WIDTH" bracket in FIG. 1 and FIG. 2), according to some example embodiments. The metal contacts 225 are displayed as electrical contacts 125 having backward diagonal line shading in FIG. 1. The top doped semiconductor 210 and the bottom doped semiconductor 230 are opposite types (e.g., the top doped semiconductor 210 is a P-type and the bottom doped semiconductor 230 is in N-type, or vice versa). Light propagates in the silicon layer 240 which comprises asymmetric-width waveguides W1 and W2, which have different widths. The silicon layer 240 is separated from the bottom doped semiconductor via separation layer 235 (e.g., dielectric cladding, an air gap). The silicon layer 240 is located on a buried oxide layer 245 (BOX) which is disposed on a silicon wafer handle 250. The silicon layer 240, the buried oxide layer 245, and silicon wafer handle are part of a silicon on insulator (SOI) wafer 255, according to some example embodiments.

Figure 3:
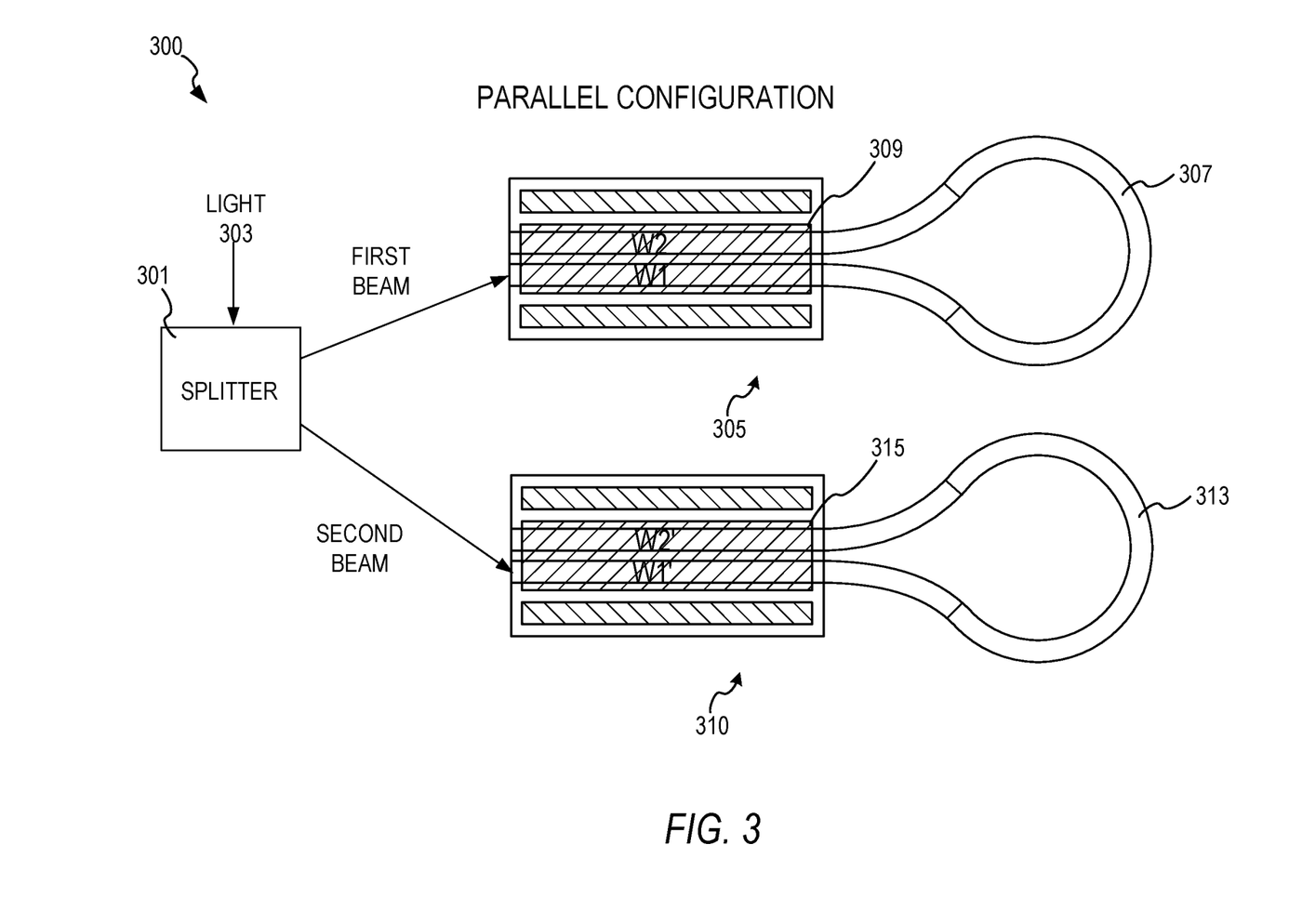
FIG. 3 shows an optical receiver in a parallel configuration, according to some example embodiments.

FIG. 3 shows an optical receiver 300 in a parallel configuration, according to some example embodiments. The optical receiver 300 is an example of a polarization diversity receiver (PDR) in which two photodetectors, photodetector 305 and photodetector 310, function in parallel to generate photocurrent from two input beams in different polarization states.

Each of the photodetectors 305 and 310 comprise two sequential asymmetric-width waveguides connected by waveguide loops, as discussed in FIG. 1. In some example embodiments, W1 and W1' have the same width (e.g., 1.5 microns) and W2 and W2' have the same smaller width (e.g., 1 micron). In those example embodiments, light propagating through respective photodetectors maintain the same sequence of waveguides under the heterogenous absorption regions (e.g., mesa 309 and 315). In some example embodiments, the photodetector 305 and the photodetector 310 share identical geometry and identical orientation (e.g., no flips, no rotations) on a PIC to avoid potential asymmetry in the fabrication process, which may cause responsivity difference between the differently oriented detectors.

In some example embodiments, a splitter 301 (e.g., a polarization-splitting grating coupler) splits incoming light 303 (e.g., light from a single-mode fiber) into orthogonally polarized beams: a first beam that is input into photodetector 305 and a second beam that is input into detector 310. In particular, the first beam propagates along an initial waveguide path W1 of photodetector 305, around loop 307, and back through a return waveguide path W2 of photodetector 305. As the first beam propagates through the initial and return waveguide paths W1 and W2, a light absorbing layer 309 of photodetector 305 generates one or more electrical signals, as discussed above. Similarly, the second beam propagates along another initial waveguide W1', around loop 313, and back through a return waveguide W2' of photodetector 310. As the second beam propagates through the initial and return waveguides W1' and W2, a light absorbing layer 315 of photodetector 310 generates additional photocurrent. The two orthogonal modes of the first and second beams have the same confinement factor with respect to the light absorbing layers, thus have the same modal absorption. The photocurrent generated by the two photodetectors 305 and 310 can then be combined via common electrical contacts, as discussed in further detail below with reference to FIG. 8. In contrast to past approaches, light beams in receiver 300 propagate through respective receivers in the same order under the absorbing layers, thereby maintain modal absorptions and responsivity.

Further, according to some example embodiments, the first beam and the second beam are further processed by additional elements, such as wavelength splitters and semiconductor optical amplifiers (SOAs). In some embodiments, the first and second beams encounter the same the additional elements in the same order to maintain responsivity and combinability of final resultant electrical signal.

Figure 4:
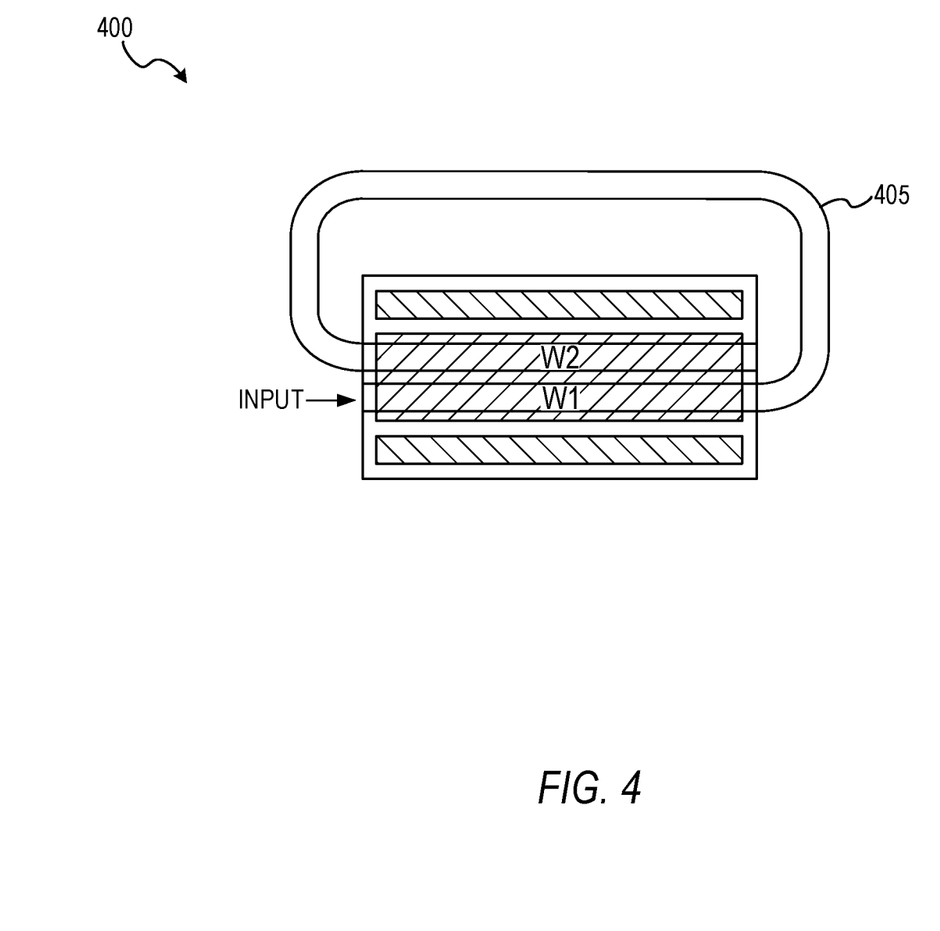
FIG. 4 shows a co-propagating photodetector, according to some example embodiments.

In some example embodiments, though the waveguides W1 and W2 have different widths to prevent coupling and loss, portions of light may couple between waveguides. For example, with reference to photodetector 100 in FIG. 1, return loss can occur when light propagating in waveguide W2 couples into waveguide W1. Return loss can be mitigated by co-propagating the light in waveguides so that the light travels in the same direction. As used here, counter-propagating light occurs when the light in the first waveguide and second waveguides propagate in opposite directions (e.g., as in photodetector 100, FIG. 1), whereas co-propagating light occurs when light in the first and second waveguides propagate in the same direction (e.g., both propagate from left to right). propagating in a direction to the light propagating in a nearby second waveguide parallel to the first waveguide. FIG. 4 shows a co-propagating photodetector 400, according to some example embodiments. In co-propagating photodetector 400, light is input into a first waveguide (W1) and propagates around a loop 405 and into a second waveguide (W2) on the same side of the co-propagating photodetector 400. Although FIG. 4 displays a single photodetector 400, it is appreciated that the co-propagating configuration can be combined with other embodiments of other figures. For example, two co-propagating photodetectors can be implemented in a polarization diversity receiver (e.g., optical receiver 300, FIG. 3).

Figure 5:
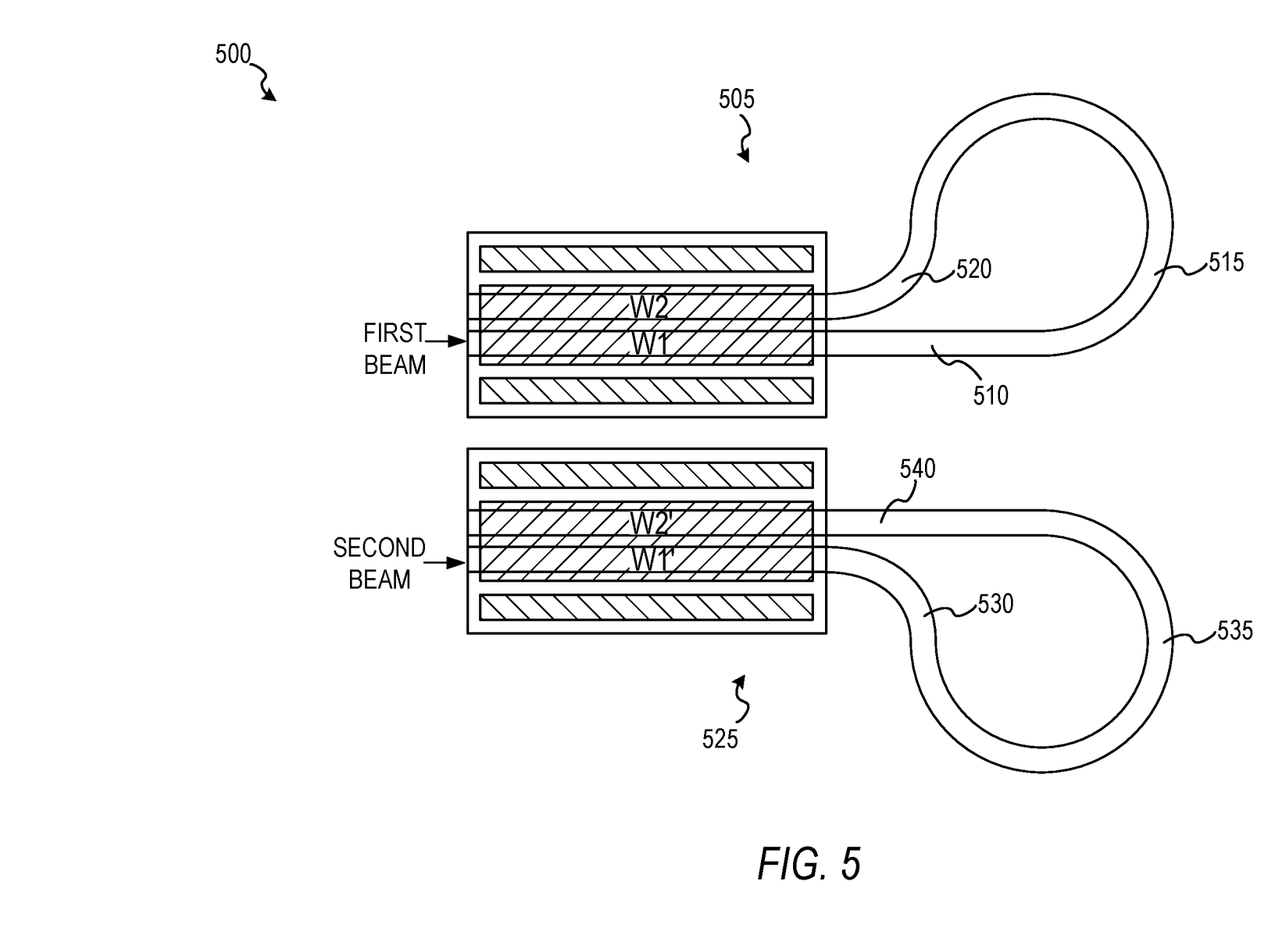
FIG. 5 shows an example optical receiver having photodetectors having different optical element orders, according to some example embodiments.

FIG. 5 shows an example optical receiver 500 having photodetectors having different optical element orders, according to some example embodiments. Generally, waveguides that connect sequential waveguides are similar in length to ensure they undergo the same loss and maintain the same responsivity. However, the shapes can vary according to different considerations have (e.g., design layout and requirements of a given PIC) so long as the overall optical paths have substantially the same loss. In the example illustrated, the optical receiver 500 comprises photodetectors with different bend orders that can be integrated into different PIC layouts. In the first photodetector 505, the first beam emanates from the initial waveguide W1, into a straight section 510, into a circular section 515, into a right-angle section 520, and back into return path waveguide W2 of photodetector 505. The second photodetector 525 has different bend order in mirror symmetry of photodetector 505: the second beam emanates from the initial waveguide W1' into a right-angle section 530, a circular section 535, a straight section 540 and back into return path waveguide W2' of photodetector 525. In some example embodiments, the widths of waveguides W1 and W1' are equal, and the widths of W2 and W2' are equal.

Figure 6:
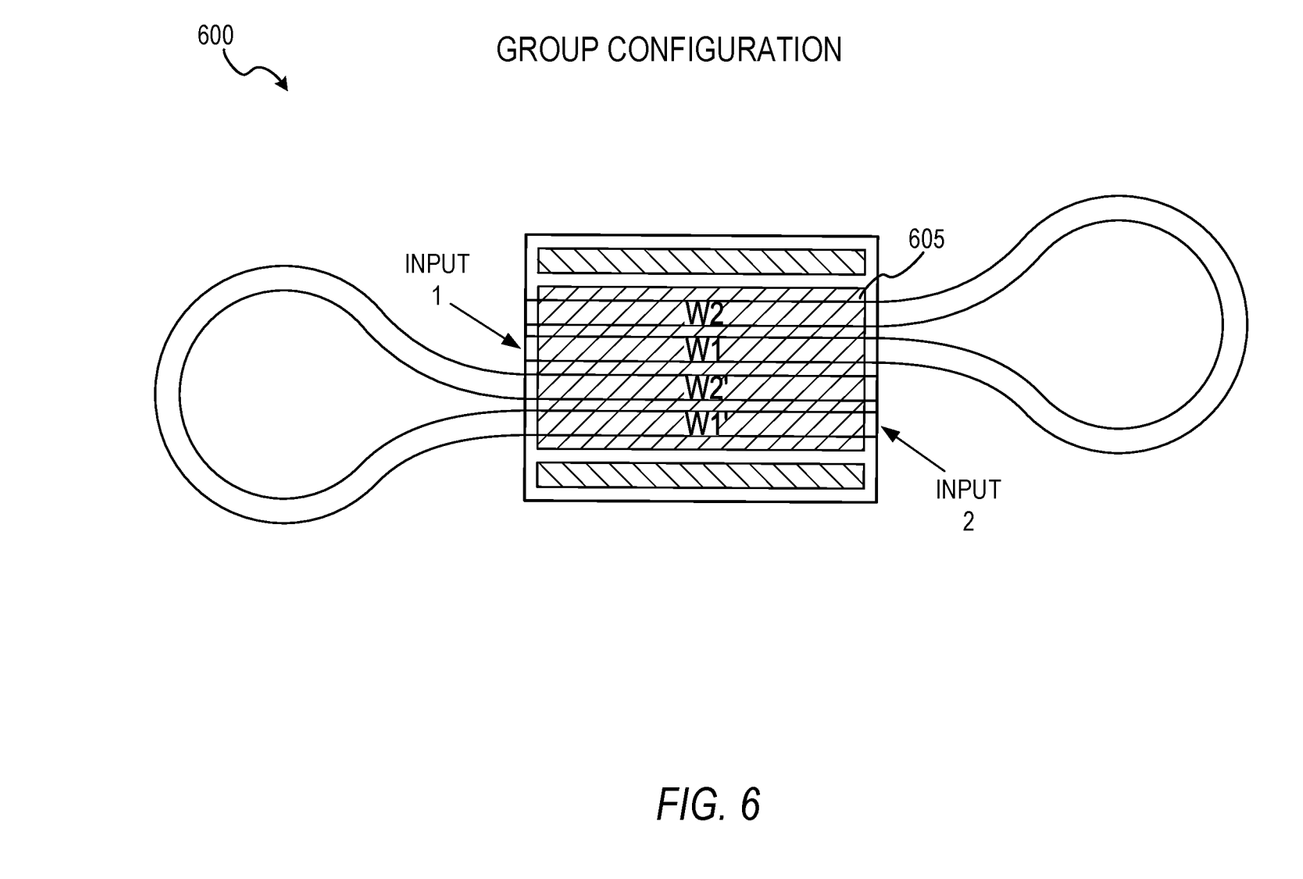
FIG. 6 shows an example optical receiver in a group configuration, according to some example embodiments.

FIG. 6 shows an example optical receiver 600 in a group configuration, according to some example embodiments. The optical receiver 500 comprises a single mesa 605 that is disposed over two pairs of sequential waveguides, including a first pair W1 and W2 and a second pair W1' and W2'. In some example embodiments, W1 and W1' share the same first width (e.g., 4 microns) and the W2 and W2' have share the same second width that is different than the first width (e.g., 2 microns). In this way, each waveguide has a different width that its neighboring waveguides (e.g., W1 has a different width than both W2 and W2', thereby avoiding coupling between W1 and W2 or W2').

Figure 7:
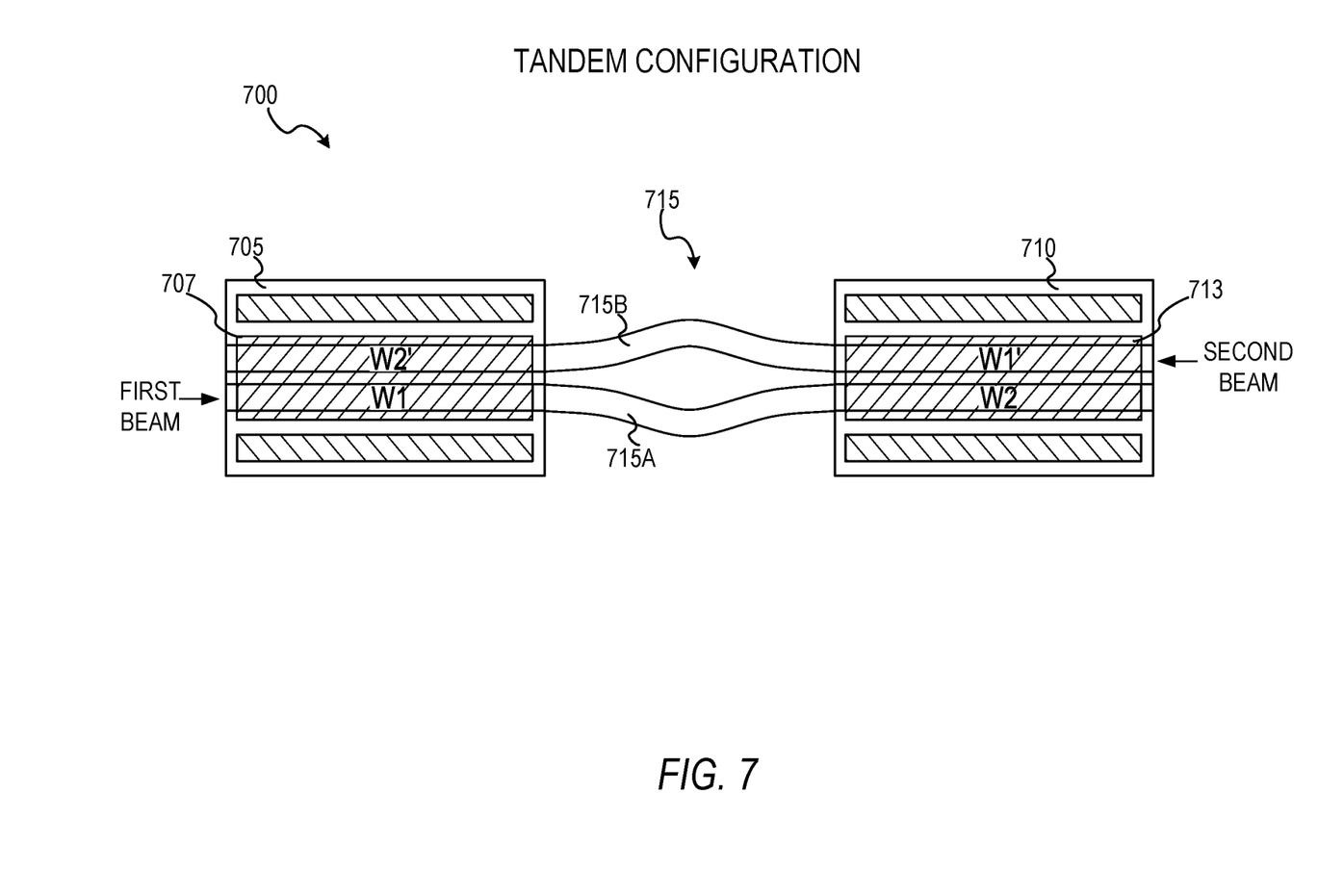
FIG. 7 shows an example high-speed optical receiver in a tandem configuration, according to some example embodiments.

Generally, for high speed operation, the total optical path length over which absorption occurs, including any passive silicon sections, may need to be minimized. For a 50G symbol rate (5E10 symbols/second), the symbol duration is 20 ps. If the modal index of the waveguide is ~3.5, the symbol duration corresponds to a path length of 1.7 mm. In some example embodiments, to keep from degrading the signal the path length should be no larger than ~10% of the symbol duration, so 170 microns. To this end, FIG. 7 shows an example high-speed optical receiver 700 in a tandem configuration having 180-degree rotational symmetry, according to some example embodiments. As used here, tandem denotes that the photodetectors function in concert to generate current (e.g., by absorbing portions of two separate beams using two sets of sequential waveguides that are split between the photodetectors).

One advantage of optical receiver 700 is that the optical path length of light can be absorbed is the shortened by avoiding passive waveguide loops (e.g., loop 120, FIG. 1). In the example illustrated, the optical receiver 700 comprises a first photodetector 705 and a second photodetector 710 which are connected by passive waveguides 715 (e.g., passive waveguide 715A and passive waveguide 715B) that function to separate the optical paths of the different beams. In the example embodiment of FIG. 7, a first sequential waveguide pair includes W1 and W2, which have different widths. The first beam propagates from W1 and is partially absorbed by mesa 707. The first beam then propagates from W1 to W2 of detector 710 via passive waveguide 715A, which is tapered to accommodate between width differences of waveguides W1 and W2, according to some example embodiments. The first beam undergoes further absorption by mesa 713 of detector 710.

Receiver 700 further comprises a second sequential waveguide pair that includes W1' and W2', which have different widths. In some example embodiments, W1 and W1' have a first width (e.g., 1.5 microns) and the W2 and W2' have a second width (e.g., 1 micron) that is different than the first width, to prevent coupling and loss between neighboring waveguides (e.g., to prevent coupling between W1' and W2). The second beam propagates from W1' and is partially absorbed by mesa 713. The second beam then propagates from W1' to W2' of detector 710 via passive waveguide 715B, which is tapered to accommodate between width differences of waveguides W1' and W2'. The second beam then undergoes further absorption by mesa 707 of detector 705.

Figure 8:
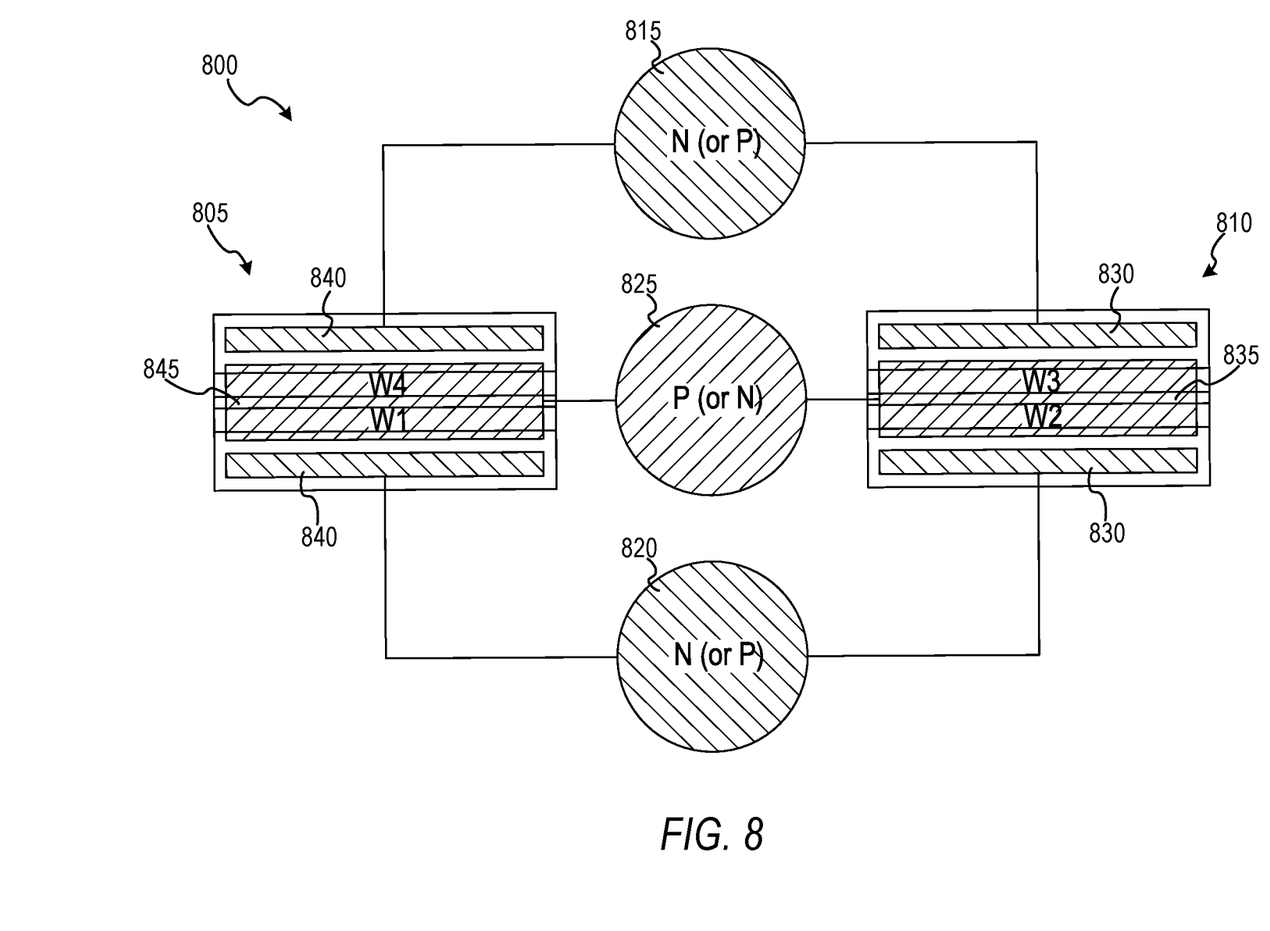
FIG. 8 shows an example electrical architecture for electrically connecting different photodetectors, according to some example embodiments.

FIG. 8 shows an example electrical architecture 800 for electrically connecting different photodetectors, according to some example embodiments. In the example illustrated, a first photodetector 805 transduces light in a first polarization state and the second photodetector 810 transduces lighting a second polarization state that is orthogonal to the first polarization state. The passive waveguides connecting the different waveguides in the photodetectors 805 and 810 are omitted in FIG. 8 for clarity, though it is appreciated that the first photodetector 800 and the second photodetector 810 may have loop waveguides connecting their respective waveguide paths or non-loop waveguides (e.g., passive waveguides 715 in FIG. 7). The two photodetectors 805 and 810 are electrically connected using common nodes including a first node 815, a second node 825, and a third node 820. The first node 815 and the third node 820 may make electrical contact to a same type of doped semiconductor (e.g., N-type) and the second node 825 makes contact to an opposite type of doped semiconductor (e.g., P-type). In the first photodetector 805, the semiconductor areas 840 (e.g., electrical contacts disposed on the semiconductor areas), both of which are of the same semiconductor material type (e.g., N-type), are electrically connected to the first node 815 and the second node 820. Further, the mesa 845 of the first photodetector 805 is electrically connected to the second node 825.

Likewise, in the second photodetector 810 the semiconductor areas 830, both of which are of the same semiconductor material type (e.g., N-type), are electrically connected to the first node 815 and the second node 820. Further, the mesa 835 of the second photodetector 810 is electrically connected to the second node 825. Both semiconductor mesas 835 and 845 (connected to 825) share a common semiconductor material type, and all semiconductor areas 830 and 840 (connected to first node 815 and second node 820) share a common semiconductor material type, which in some example embodiments will be of the opposite polarity. In some example embodiments, the nodes 815, 825, and 820 are connected to a transmission line for output (e.g., a ground-signal-ground (GSG) transmission line).

Figure 9:
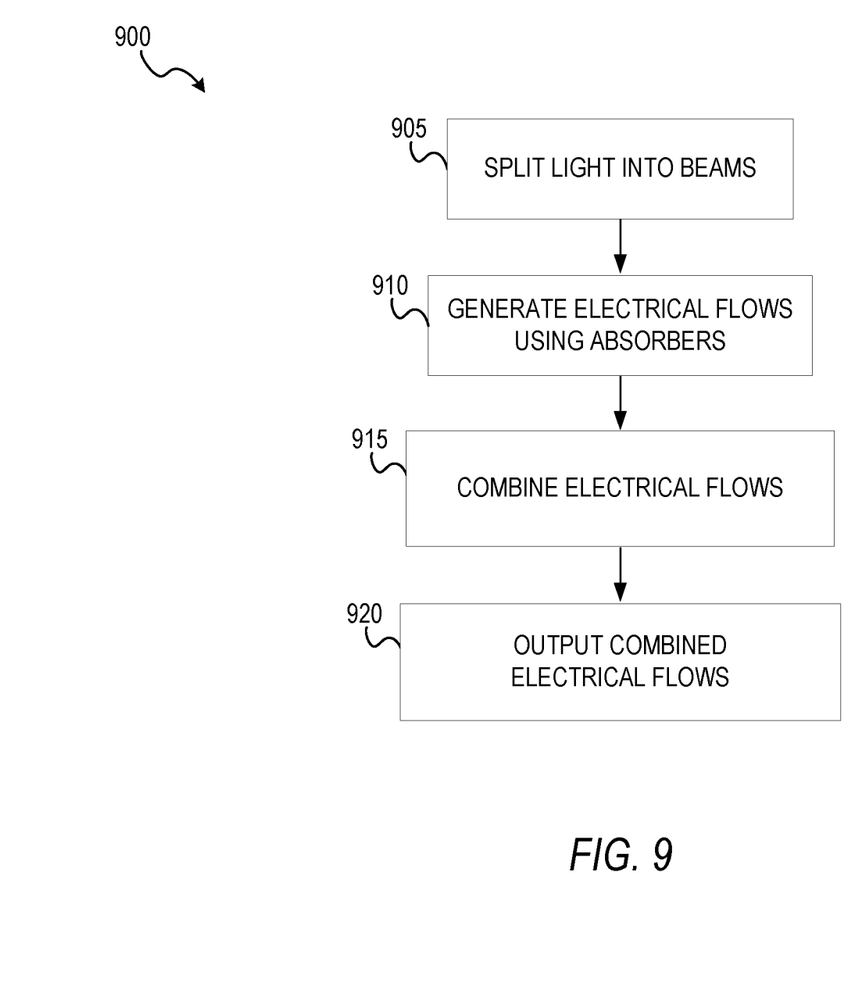
FIG. 9 shows a flow diagram of a method for transducing light using sequential waveguides of different widths, according to some example embodiments.

FIG. 9 shows a flow diagram of a method 900 for transducing light using sequential waveguides of different widths, according to some example embodiments. At operation 905, light is split into multiple beams having different polarization states. For example, with reference to FIG. 3, the input light 303 is received from a single fiber-optic and is input into the splitter 301, which splits the light 303 into a first beam in a first polarization state and a second beam and a second polarization state that is orthogonal to the first polarization state. In some example embodiment, the input light 303 comprises one or more signals and the first beam and second beam comprise the same one or more signals, albeit at different power levels due variable polarization of the input light 303.

At operation 910, electrical flows (e.g., current) are generated using light absorbing layers. For example, with reference to FIG. 3, the photodetector 305 transduces the first beam into a first electrical flow and the photodetector 310 transduces the second beam into a second electrical flow.

At operation 915, the electrical flows are combined. For example, with reference to FIG. 8, a first electrical flow generated from a first photodetector 805 and second electrical flow generated by a second photodetector 810 are added together via common electrical nodes, e.g., the first node 815, the second node 825, and the third node 820. In some embodiments, the first electrical flow is a first photocurrent having a set of electrical signals (e.g., the same signals carried by the input light) and the second electrical flow is a second photocurrent having the same set of electrical signals. Thus, when the first and second photocurrents are combined, the final photo current is the sum of the first and second photocurrents from respective photodetectors.

At operation 920, the combined electrical flows are output via the common nodes. For example, the combined electrical flows may be output to different integrated circuits (e.g., transmitted to application specific integrated circuit (ASIC) for further processing) as discussed in further detail below with reference to FIG. 10.

Figure 10:
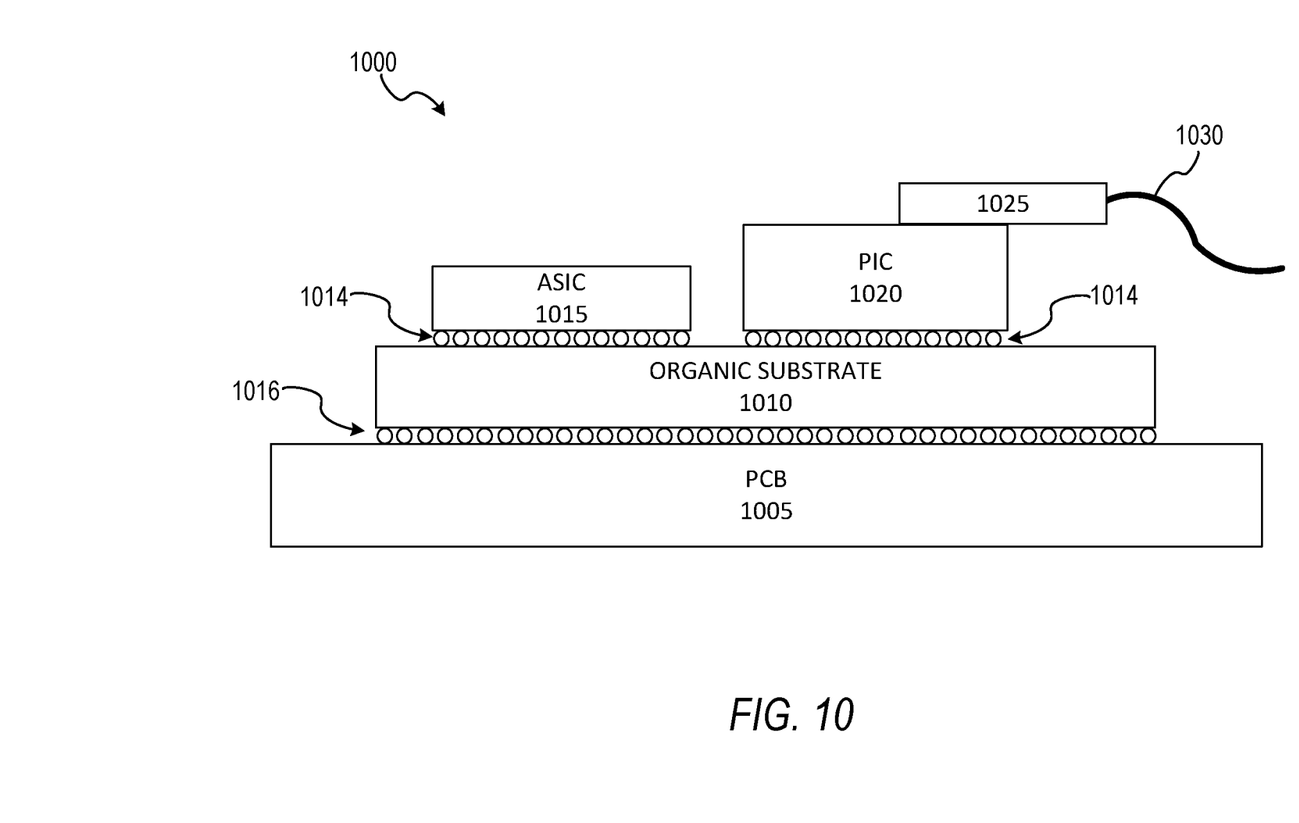
FIG. 10 is an illustration of a system including one or more optical devices according to an embodiment of the disclosure.

FIG. 10 is an illustration of a system 1000 including one or more optical devices according to an embodiment of the disclosure. In this embodiment, system 1000 is shown to include printed circuit board (PCB) substrate 1005, organic substrate 1010, ASIC 1015, and photonic integrated circuit (PIC) 1020. In this embodiment, 1020 may include one or more optical devices described above (e.g., photodetector 100, optical receiver 700). PIC 1020 exchanges light with fiber 1030 via prism 1025; said prism is a misalignment-tolerant device used to couple an optical mode on to a single mode optical fiber, according to some example embodiments. The optical devices of PIC 1020 are controlled, at least in part, by control circuitry included in ASIC 1015. Both ASIC 1015 and PIC 1020 are shown to be disposed on copper pillars 1014, which are used for communicatively coupling the ICs via organic substrate 1010. PCB 1005 is coupled to organic substrate 1010 via ball grid array (BGA) interconnect 1016, and may be used to interconnect the organic substrate (and thus, ASIC 1015 and PIC 1020) to other components of system 1000 not shown—e.g., interconnection modules, power supplies, etc.

The following are examples of embodiments:

1. A method for transducing light, the method comprising: receiving a light beam using an optical structure including sequential waveguides of different widths including a first waveguide and a second waveguide, the received light beam propagating from the first waveguide to the second waveguide that has a different width to the first waveguide; and generating an electrical current by transducing light using a light absorbing layer that is proximate to one or more of the sequential waveguides.

2. The method of example 1, wherein the light absorbing layer is proximate to the first and second waveguides, and wherein the light absorbing layer transduces light in the first and second waveguides.

3. The method of examples 1-2, wherein the optical structure is in a parallel configuration, the optical structure further comprising a third waveguide and a fourth waveguide having different widths, and an additional light absorbing layer that is parallel to the light absorbing layer, the additional light absorbing layer being proximate to the third and fourth waveguides.

4. The method of examples 1-3, further comprising: receiving additional light using the optical structure, the additional light propagating from the third waveguide to the fourth waveguide; and generating, using the additional light absorbing layer, an additional electrical current by transducing the additional light in the third and fourth waveguides.

5. The method of examples 1-4, further comprising: splitting initial light into the light and the additional light, the light and additional having different polarization states; and generating a combined electrical current by combining the electrical current and the additional electrical current.

The method of examples 1-5, wherein the optical structure is in a tandem configuration, the optical structure further comprising a third waveguide and a fourth waveguide having different widths, and an additional light absorbing layer that is proximate to the light absorbing layer; wherein the light absorbing layer is proximate to the first and fourth waveguides and the additional light absorbing layer is proximate to the second and third waveguides; and wherein the electrical current is generated by transducing light in the first and fourth waveguides using the light absorbing layer.

7. The method of examples 1-6, further comprising: receiving an additional light beam, the additional light beam propagating from the third waveguide to the fourth waveguide; and generating, using the additional light absorbing layer, an additional electrical current by transducing light in the third and fourth waveguides.

8. The method of examples 1-7, wherein the first waveguide and the third waveguide share a same width and the second waveguide, and the fourth waveguide share a same width.

9. The method of examples 1-8, wherein the optical structure is in a group configuration, the optical structure further comprises a third waveguide and a fourth waveguide that has a different width than the third waveguide, the third waveguide being coupled to the fourth waveguide; and wherein the light absorbing layer is proximate to a group comprising the first, second, third, and fourth waveguides; and wherein the light absorbing layer transduces light in the first, second, third, and fourth waveguides.

10. The method of examples 1-9, wherein the first waveguide is connected to the second waveguide by a passive waveguide.

11. The method of examples 1-10, wherein the passive waveguide tapers to compensate for width differences.

12. The method of examples 1-11, wherein the passive waveguide is a loop.

13. The method of examples 1-12, wherein the light absorbing layer is an absorbing semiconductor and the sequential waveguides are silicon waveguides.

14. The method of examples 1-13, wherein the optical structure is a polarization diversity optical receiver.

15. An optical structure comprising: sequential waveguides of different widths, the sequential waveguides comprising a first waveguide that is connected to a second waveguide having a different width to the first waveguide; and a light absorbing layer that is proximate to the one or more of the sequential waveguides to generate electrical current by transducing light in one or more of the sequential waveguides.

16. The optical structure of example 15, wherein the light absorbing layer is proximate to the first and second waveguides, and wherein the light absorbing layer transduces light in the first and second waveguides.

17. The optical structure of examples 15-16, wherein the optical structure is in a tandem configuration, the optical structure further comprises a third waveguide and a fourth waveguide having different widths, and an additional light absorbing layer that is proximate to the light absorbing layer; wherein the light absorbing layer is proximate to the first and fourth waveguides and the additional light absorbing layer is proximate to the second and third waveguides; and wherein the light absorbing layer transduces light in the first and fourth waveguides and the additional light absorbing layer transduces light in the second and third waveguides.

18. The optical structure of examples 15-17, wherein the first waveguide is connected to the second waveguide by a passive waveguide.

19. The optical structure of examples 15-18, wherein the passive waveguide tapers to compensate for width differences.

20. The optical structure of examples 15-19, the optical structure further comprising: an optical splitter to split input light into multiple beams with different polarization states, wherein the light absorbing layer transduces one of the multiple beams propagating in at least one of the first waveguide or the second waveguide.

In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. A method for transducing light, the method comprising:
receiving a first light beam at a first optical structure that comprises a first waveguide and a second waveguide;
receiving a second light beam at a second optical structure that comprises a third waveguide and a fourth waveguide, the first and the third waveguides arranged as a first set of sequential waveguides, and the second and the fourth waveguides arranged as a second set of sequential waveguides, the first optical structure and the second optical structure arranged in a tandem optical structure;
propagating the first light beam through the first waveguide of the first optical structure and through the third waveguide of the second optical structure, the first waveguide and the third waveguide having different widths;
propagating the second light beam through the fourth waveguide of the second optical structure and through the second waveguide of the first optical structure, the fourth waveguide and the second waveguide having different widths, the first light beam in the first waveguide and the second light beam in second waveguide propagating in opposite directions in the first optical structure, the first light beam in the third waveguide and the second light beam in the fourth waveguide propagating in opposite directions in the second optical structure; and
generating electrical current by transducing the propagated light beams using light absorbing layers in the first optical structure and the second optical structure.

2. The method of claim 1, wherein the tandem optical structure further comprises a tapered waveguide that connects the first waveguide and the third waveguide, the tapered waveguide having a taper to compensate for a different in width of the first waveguide and the third waveguide.

3. The method of claim 2, wherein the tandem optical structure further comprises another tapered waveguide that connects the fourth waveguide to the second waveguide, the another tapered waveguide having a taper to compensate for a different in width of the fourth waveguide and the second waveguide.

4. The method of claim 1, wherein the first optical structure comprises a first light absorbing layer proximate to the first waveguide and the second waveguide, wherein the first waveguide and the second waveguide have different widths.

5. The method of claim 4, wherein the first light absorbing layer generates current from the light beams propagating through the first waveguide and the second waveguide.

6. The method of claim 1, wherein the second optical structure comprises a second light absorbing layer proximate to the third waveguide and the fourth waveguide, wherein the third waveguide and the fourth waveguide have different widths.

7. The method of claim 6, wherein the second light absorbing layer generates current from the light beams propagating through the third waveguide and the fourth waveguide.

8. The method of claim 1, wherein the first optical structure generates a portion of the electrical current, and the second optical structure generates another portion of the electrical current.

9. The method of claim 8, further comprising:
combining the portion and the another portion of the electrical current using an electrical circuit connected to the first optical structure and the second optical structure.

10. The method of claim 1, wherein the first waveguide and the fourth waveguide share a same width.

11. The method of claim 10, wherein the second waveguide and the third waveguide share a same width that is different from widths of the first waveguide and fourth waveguide.

12. The method of claim 1, further comprising:
splitting initial light into the one of the light beams and the another of the light beams, the one of the light beams and the another of the light beams having different polarization states.

13. The method of claim 1, wherein the light absorbing layers are semiconductor layers.

14. The method of claim 1, wherein the first waveguide, the second waveguide, the third waveguide, and the fourth waveguide are silicon waveguides.

15. The method of claim 1, wherein the tandem optical structure is a polarization diversity optical device.

16. An optical device to transduce light beams, the optical device comprising:
a first optical structure comprising a first light absorbing layer, a first waveguide, and a second waveguide;
a second optical structure comprising a second light absorbing layer, a third waveguide, and a fourth waveguide, the first optical structure and the second optical structure arranged in a tandem optical structure, wherein the first and the third waveguides arranged as a first set of sequential waveguides to propagate a first light beam through the first waveguide of the first optical structure and through the second waveguide of the second optical structure, the first waveguide and the third waveguide having different widths, wherein the second and the fourth waveguides arranged as a second set of sequential waveguides to propagate a second light beam through the fourth waveguide of the second optical structure and through the second waveguide of the first optical structure, the fourth waveguide and the second waveguide having different widths, wherein the first light beam in the first waveguide and the second light beam in second waveguide propagate in opposite directions in the first optical structure, and the first light beam in the third waveguide and the second light beam in the fourth waveguide propagate in opposite directions in the second optical structure, wherein the first and second light absorbing layers generate electrical current by transducing the propagated light beams.

17. The optical device of claim 16, wherein the tandem optical structure further comprises a tapered waveguide that connects the first waveguide and the third waveguide, the tapered waveguide having a taper to compensate for a different in width of the first waveguide and the third waveguide.

18. The optical device of claim 16, wherein the tandem optical structure further comprises another tapered waveguide that connects the fourth waveguide to the second waveguide, the another tapered waveguide having a taper to compensate for a different in width of the fourth waveguide and the second waveguide.

19. The optical device of claim 18, wherein the first optical structure generates a portion of the electrical current, and the second optical structure generates another portion of the electrical current, wherein the optical device further comprises electrical circuitry to combine the portion and the another portion of the electrical current.

20. The optical device of claim 16, wherein the optical device is a polarization diversity optical device.

* * * * *